United States Patent [19]

Nakamura et al.

[11] Patent Number: 4,621,376

[45] Date of Patent: Nov. 4, 1986

[54] DRIVING APPARATUS FOR STABILIZING BURST LIGHT OUTPUT

[75] Inventors: Masaru Nakamura, Kawaguchi; Osamu Kinoshita, Kawasaki, both of Japan

[73] Assignee: Kabushiki Kaisha Toshiba, Kawasaki, Japan

[21] Appl. No.: 603,893

[22] Filed: Apr. 25, 1984

[30] Foreign Application Priority Data

Apr. 28, 1983 [JP] Japan .................................. 58-73827
Aug. 11, 1983 [JP] Japan ................................. 58-145689

[51] Int. Cl.⁴ .............................................. H04B 9/00
[52] U.S. Cl. ...................................... 455/613; 372/29; 372/38; 455/618
[58] Field of Search ............... 455/613, 618, 606, 607; 372/29, 31, 33, 34, 38; 250/205

[56] References Cited

U.S. PATENT DOCUMENTS 4,166,985 9/1979 White .............................. 331/94.5 H
4,355,395 10/1982 Salter et al. ............................ 372/38
4,450,564 5/1984 Meuleman et al. ..................... 372/29

FOREIGN PATENT DOCUMENTS 2923683 1/1980 Fed. Rep. of Germany .
2448274 2/1979 France .
51-124387 10/1976 Japan .
51-147984 12/1976 Japan .

OTHER PUBLICATIONS

Bell System Technical Journal, vol. 57, No. 6 (1978), P. W. Shumate et al, "GaAlAs Laser Transmitter for Lightwave Transmission Systems", pp. 1823-1836.
McMullin-"Leveling the Output of Lasers"-IBM Tech. Disclosure Bulletin, vol. 19, #11, Apr. 1971, pp. 4474-4476.

*Primary Examiner*—Joseph A. Orsino, Jr.
*Attorney, Agent, or Firm*—Oblon, Fisher, Spivak, McClelland & Maier

[57] ABSTRACT

A work station included in a burst optical communication system has a semiconductor laser for performing light emission corresponding to a data pulse signal to be transmitted, and a bias generator for biasing the laser in accordance with a uni-directional power control technique. When an actual light output is detected to be decreased in accordance with a detection signal from a photodetector for detecting the actual light output emitted from the laser, a logic circuit in a bias generator charges a capacitor, thereby increasing the bias current supplied to the laser. However, when the actual light output exceeds an optimal reference level, the bias current stops increasing but is not decreased.

14 Claims, 14 Drawing Figures

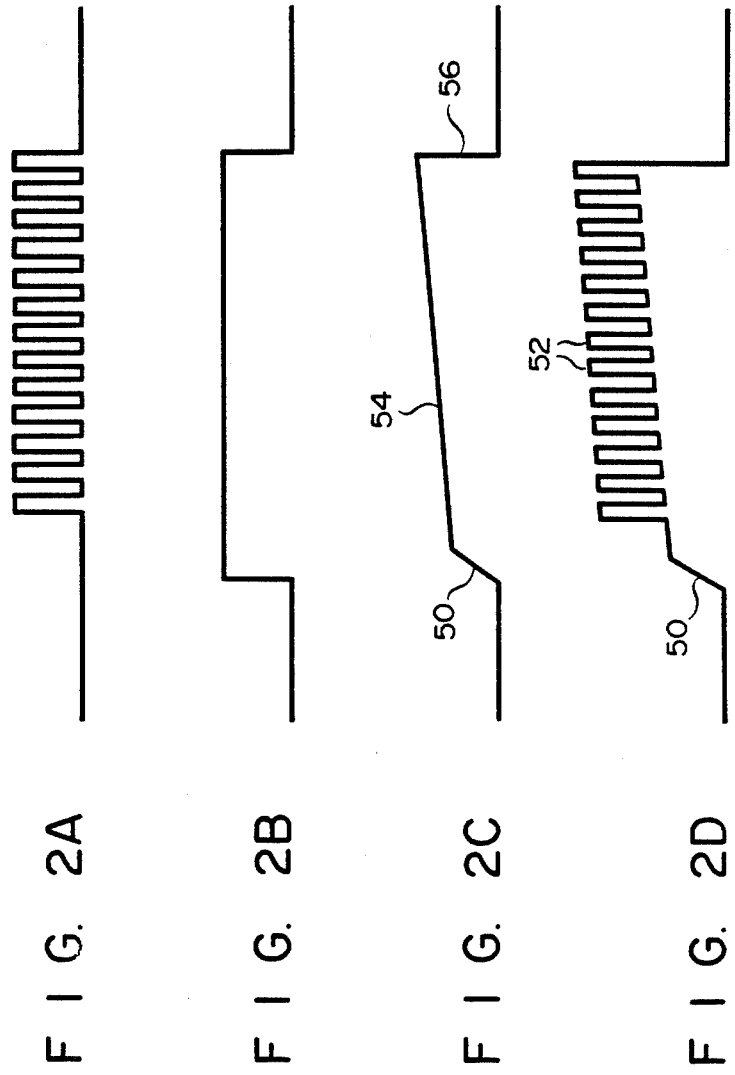

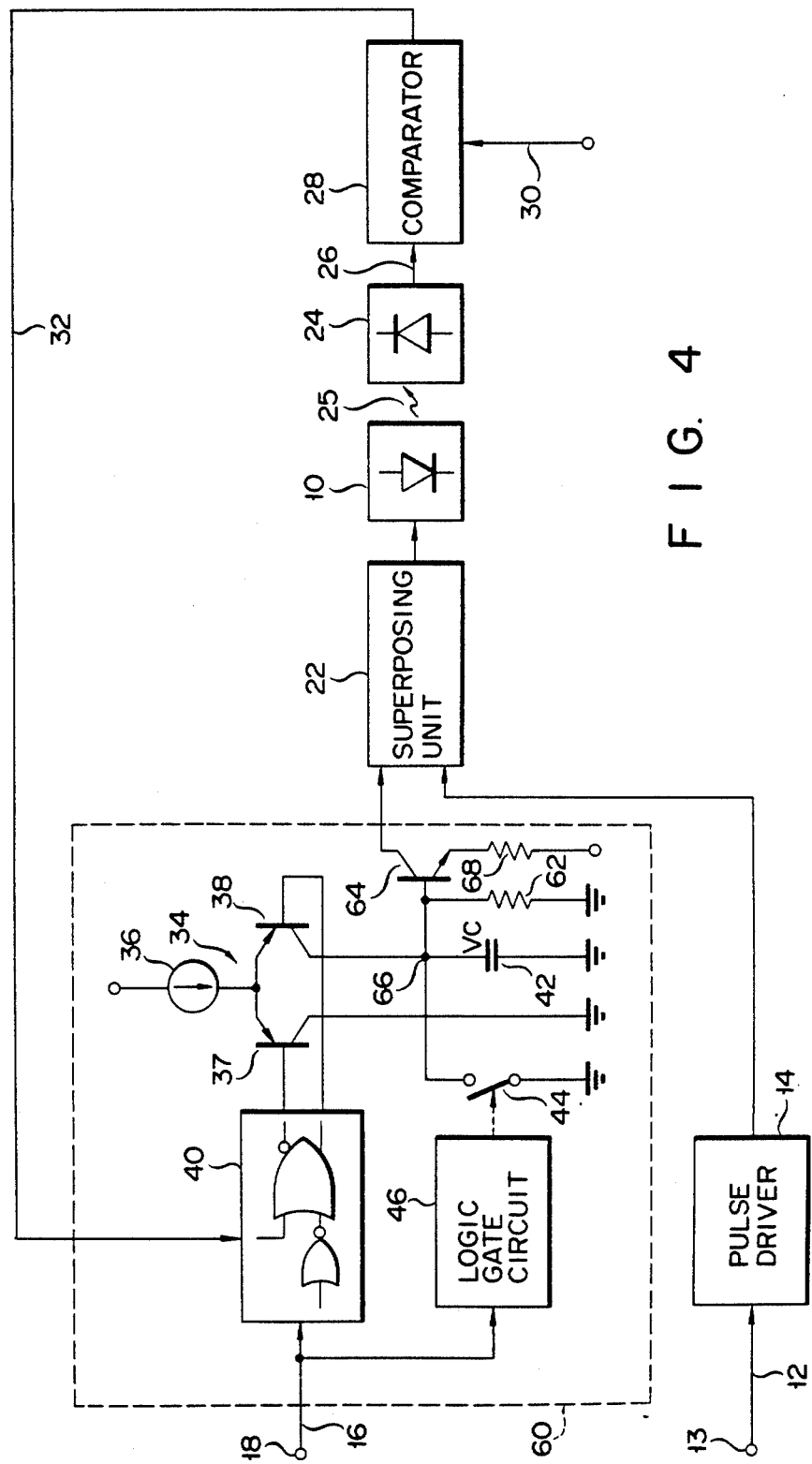
F I G. 4

DRIVING APPARATUS FOR STABILIZING BURST LIGHT OUTPUT

BACKGROUND OF THE INVENTION

The present invention relates in general to a driving technique for stabilizing an optical output in an optical data signal generating unit used in an optical communication system and, more particularly, to an apparatus suitable for data burst transmission which effectively performs temperature compensation for an output level of burst light radiated from a semiconductor light-emitting element.

The importance of optical communication systems in achieving data transmission between a plurality of work stations has been increasing. An optical star network system has been developed as one type of an optical communication network system. A digital optical signal exchange between the work stations connected in a system of this type is performed through a burst signal in a time division manner. The burst signal is transmitted from a specific sending work station to a receiving work station within a predetermined period which is less than 1 msec as assigned by time division. For example, the sending station may transmit data having a frequency of 10 MHz or higher to the receiving station. In general, most optical communication network systems have optical signal generators each of which comprises a semiconductor laser whose luminous efficiency is very sensitive to changes in temperature. Therefore, a new problem is presented by such optical communication network systems, although this problem does not occur in conventional electrical signal transmission systems using a coaxial cable. The first problem to be solved is variations in a burst optical output which are caused by heat generation from the semiconductor laser during the communication or burst period. The luminous efficacy of a semiconductor light-emitting element including a semiconductor laser diode is degraded due to heat generation from the element during the burst period. In the laser diode, the threshold current level is increased due to heat radiation therefrom, and an optical output from the laser diode is degraded. As a result, this leads to a crucial problem wherein a thermal sag phenomenon occurs in the optical communication system.

At present, in order to compensate for an optical output change due to a temperature change, an automatic power control (APC) is arranged in the optical communication system. The APC is a type of analog control. According to the APC technique, a bias current flowing in the laser diode is increased or decreased in response to changes in temperature, but is controlled to be kept close to the threshold current level (bi-directional APC). However, the conventional optical output stabilizing arrangement has a slow time response as compared with the high-speed of the burst signal transmission. In order to apply the conventional optical output stabilizing arrangement to data burst transmission, a feedback loop response of a burst signal having a frequency of several megahertz must be achieved. In order to improve the response speed, ultra-high-speed active devices must be used which have a high cost, the apparatus as a whole expensive. In addition to the above drawback, the conventional optical output stabilizing technique presents the following worse problems. Since two types of feedback operation modes (i.e., increase and decrease) are used to set the drive current or bias current of the laser diode to be closer to the target value, oscillation in response to excess phase transition caused by the delay factors of the circuit elements, such as photodetectors and transistors, occurs. As a result, the compensation efficiency is degraded.

SUMMARY OF THE INVENTION

It is an object of the present invention to provide a new and improved optical output stabilizing apparatus suitable for an optical communication system wherein light emission from a light-emitting element arranged in the system is temperature-compensated and stabilized.

According to the present invention, there is provided an optical output stabilizing control apparatus suitable for use in a burst optical communication system wherein an optical data transmission period at a work station is short (up to about several miliseconds) so that any adverse affect caused by a change in the ambient temperature can be substantially neglected, and wherein uni-directional power control is performed only to increase the bias compensation. This basic concept is based on an assumption that only the degradation of an optical output adversely affected by heat radiation from the semiconductor light-emitting element needs to be considered. Therefore, the optical output stabilizing control apparatus comprises: a photodetector device for detecting light emitted from a semiconductor light-emitting element and generating a corresponding electrical detection signal; and a bias controller device, connected to the semiconductor light-emitting element and the photodetector device, for compensating the light-emitting element by means of the uni-directional power control such that a bias current supplied to the light-emitting element increases in response to the detection signal when an optical output is adversely affected and lowered by heat radiating from the semiconductor light-emitting element.

BRIEF DESCRIPTION OF THE DRAWINGS

The present invention is best understood by reference to the accompanying drawings, in which:

FIGS. 2A to 2F respectively show waveforms of signals generated from the main part of the unit shown in FIG. 1;

FIG. 4 is a block diagram showing the overall arrangement of an improved bias control unit for stabilizing a burst optical output from the optical communication work station according to a second embodiment of the present invention.

DETAILED DESCRIPTION OF THE PREFERRED EMBODIMENTS

Figure 1:
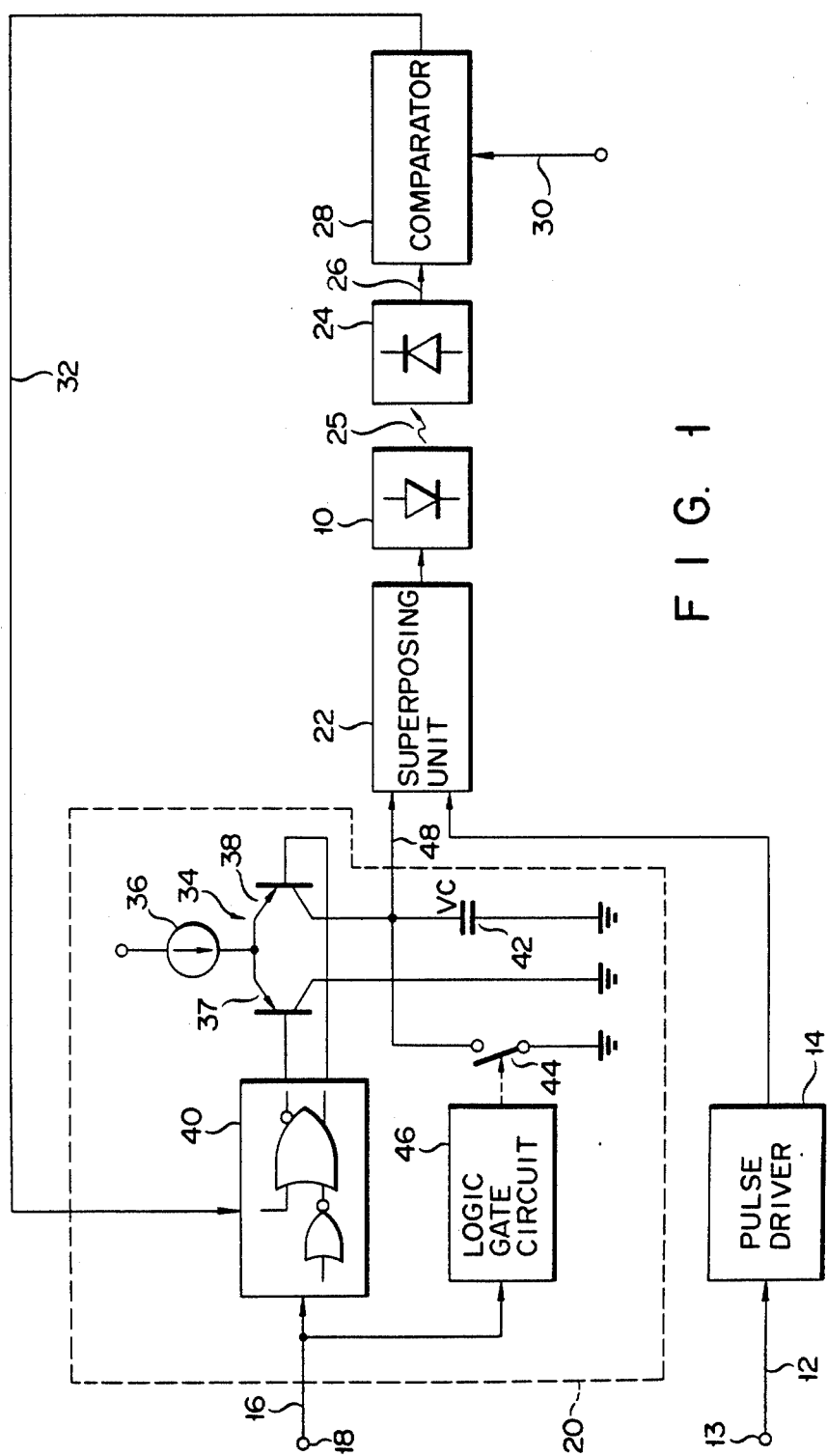
FIG. 1 is a block diagram showing the overall configuration of a bias control unit for stabilizing burst optical output to be transmitted from a work station including a uni-directional automatic power control unit according to a first embodiment of the present invention.

FIG. 1 schematically illustrates the arrangement of an optical output stabilizing drive unit applied to a burst optical data communication system according to a first embodiment of the present invention. Referring to FIG. 1, reference numeral 10 denotes a semiconductor laser which serves as a light-emitting element for emitting burst optical data. In this embodiment, a GaAlAs DH highly multilongitudinal mode laser was used. A data burst signal 12 (32-MHz high-speed signal) to be transmitted from the laser 10 is supplied to a pulse driver 14 through a data input terminal 13. On the other hand, a sending request signal 16 which determines the transmission timing of the data burst signal is supplied through an input terminal 18 to a bias current generator 20 to generate a necessary bias current for the laser 10. The pulse driver 14 and the bias current generator 20 are connected to the laser 10 through a signal superposing unit 22.

A photodetector 24 such as a PIN photodiode is arranged in the vicinity of the laser 10 so as to partially detect the actual laser light 25 emitted from the laser 10. The photodetector 24 supplies to the first input terminal of a comparator 28 an electrical detection signal 26 which corresponds to the detected laser emission. A reference signal 30 is supplied to the second input terminal of the comparator 28. The comparator 28 generates a comparison signal 32 having a high or low level in accordance with the comparison between the two input signals supplied thereto. This comparison signal 32 is then supplied to the bias current generator 20, thereby controlling the output bias current generated from the bias current generator 20.

The bias current generator 20 includes a current switch 34 consisting of a constant current source 36 and two pnp transistors 37 and 38. The base electrodes of the transistors 37 and 38 are connected to a logic gate circuit 40 to which the sending request signal 16 and the comparison signal 32 are supplied. The logic gate circuit 40 controls the switching operation of the two transistors 37 and 38 in response to the signal level (high or low) of the signal 32 supplied from the comparator 28, thereby charging or discharging a capacitor 42 connected between ground and the collector of the transistor 38. In this embodiment, when the output signal from the comparator 28 is set at a low level, the logic gate circuit 40 renders the transistor 37 nonconductive and, at the same time, renders the transistor 38 conductive, thereby changing the capacitor 42. On the other hand, when the comparison signal 32 has a high level, the transistor 37 is rendered conductive while the transistor 38 is rendered nonconductive by the circuit 40, thereby causing the capacitor 42 to be prevented from being charged.

A discharging switch 44 is provided in parallel with the capacitor 42. The switch 44 is connected to another logic gate circuit 46 to which the data sending request signal 16 is also supplied. When the switch 44 is conductive at the end of the burst period, the capacitor 42 is forcibly discharged.

Figure 2E:
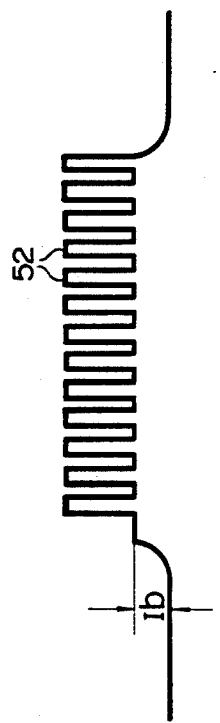

The burst optical output stabilizing drive unit according to the first embodiment of the present invention performs a uni-directional automatic power control (APC). The uni-directional APC operation for the laser 10 according to this embodiment will be described with reference to FIGS. 2A to 2E. The data burst signal 12 supplied to the pulse driver 14 through the data input terminal 13 has a high frequency pulse waveform corresponding to the digital data, as shown in FIG. 2A. Under this condition, prior to the input of the data burst signal, the sending request signal 16 having the waveform illustrated in FIG. 2B is supplied to the logic gate circuits 40 and 46 in the bias current generator 20 through the terminal 18. In this state, the photodetector 24 does not detect any laser light emitted from the laser 10, so that the electrical detection signal 26 from the photodetector 24 has a lower level than that of a first reference signal 30a which corresponds to the threshold level of the laser 10 and which is supplied to the second input terminal of the comparator 28. Therefore, the logic gate circuit 40 simultaneously receives the comparison signal 32 of low logic level and the sending request signal 16. In this case, the logic gate circuit 40 sets the transistors 37 and 38 in the first switching state (i.e., the state wherein the transistor 37 is rendered nonconductive, and the other transistor 38 is rendered conductive), so that a current from the constant current source 36 is supplied to the capacitor 42, which is thus charged. The terminal voltage Vc at the capacitor 42 increases, as indicated by reference numeral 50 in FIG. 2C, and the bias current 48 supplied to the laser 10 also increases. When the amount of light emitted from the laser 10 increases, the level of the detection signal 26 supplied from the photodetector 24 is also raised. When the detection signal level becomes higher than the level of the first reference signal 30a, the comparator 28 generates a comparison signal 32 of high logic level.

In response to this high logic level signal, the circuit 40 sets the transistors 37 and 38 in the second switching state or condition (i.e., the state wherein one transistor 37 is rendered conductive and the other transistor 38 is rendered nonconductive), thereby preventing the capacitor 42 from being charged. The terminal voltage Vc at the capacitor 42 is held at the last measured value. In other words, when the bias current supplied to the laser 10 reaches a preset proximity level to the threshold current level thereof, an increase in the bias current generated from the bias current generator 20 is stopped. Therefore, the laser 10 is biased with the proximity level. In this condition, the waveform of the data burst signal supplied to the laser 10 is illustrated in FIG. 2D. Data burst pulses 52 corresponding to the data burst signal 12 are superimposed by the superposing unit 22 on a bias current Ib generated from the bias current generator 20. The output laser as opposed to the input current ratio (amplification factor) with respect to the laser 10 can be improved or enhanced. In this manner, data burst communication with a receiving work station (not shown) is performed.

When the laser 10 is biased and the burst optical data transmission is started, the reference signal 30 supplied to the comparator 28 changes from the first reference signal 30a to a second reference signal 30b. The second reference signal 30b represents the normal amount of light when the thermal sag phenomenon caused by heat radiation from the laser 10 during the burst period does not occur. However, when the temperature of the burst optical data sending system increases due to heat radiation from the laser 10, the level of the electrical detection signal 26 generated from the photodetector 24 for detecting the actual laser light emission from the laser 10 becomes lower than that of the second reference signal 30b. In this case, the comparator 28 generates the low level signal again, and the transistors 37 and 38 are set in the first switching state under the control of the logic gate circuit 40, thereby recharging the capacitor 42. As a result, the capacitor terminal voltage Vc increases, the bias current supplied to the laser 10 increases correspondingly, and the output light from the laser 10 is subjected to temperature compensation. When the amount of light 25 output from the laser 10 increases upon the increase of the bias current, the level of the detection signal 26 from the photodetector 24 becomes higher than that of the second reference signal 30b, and the capacitor 42 stops charging. The capacitor 42 is repeatedly charged or prevented from being charged, so that the capacitor terminal voltage Vc is gradually increased during the burst period given by reference numeral 54 in FIG. 2C. The output current from the bias current generator 20 is controlled such that the bias current supplied to the laser 10 is normally held at a threshold level which varies in accordance with changes in temperature. The optical output from the laser 10 is prevented from decreasing during the burst period due to the thermal sag phoenomenon caused by heat radiation therefrom, whereby well controlled output waveform can be obtained as shown in FIG. 2E.

Figure 2F:

When the sending request signal 16 is not supplied to the bias current generator 20, the other logic gate circuit 46 renders the discharging switch 44 conductive, so that carriers charged by the capacitor 42 are discharged through the conductive switch 44, with the result that the capacitor terminal voltage Vc is abruptly decreased, as indicated by reference numeral 56 in FIG. 2C. In this case, the bias current is not supplied to the laser 10, so that the transmission period of the sending request signal 16 may be set to be on the order of several miliseconds in the burst optical communication system of this embodiment, or may be set in the range of several ten to several hundred microseconds. It should be noted that the waveform of the comparison signal 32 generated from the comparator 28 is schematically illustrated in FIG. 2F.

Figure 3A:
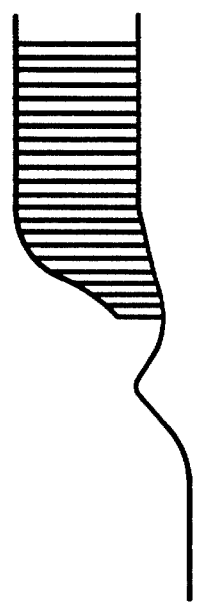
FIG. 3A shows an optical output waveform obtained in accordance with a conventional bi-directional automatic power control (APC) technique.
Figure 3B:
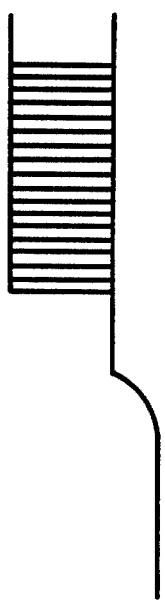
FIG. 3B shows an optical output waveform which is optimally controlled in accordance with the uni-directional APC technique of the present invention.

According to this embodiment to control the bias applied to the laser 10 on the basis of the uni-directional APC, the bias current is increased to compensate for a change in the output from the laser 10 which is caused by a change in the temperature thereof. In other words, in the unit of this embodiment, in order to compensate for a change in the output from the laser 10 which is caused by the thermal sag phenomenon, and to keep the bias at the predetermined threshold level, the bias current supplied to the laser 10 is correspondingly increased. Even if the bias current is excessively increased, and hence the optical output level of the laser 10 becomes higher than the optimal level, the bias current is not positively decreased, unlike in the conventional bi-directional APC technique. Instead, a further increase of the bias current is inhibited by preventing the further charging of the capacitor 42. The principle of this arrangement is based on two facts, that an abrupt change in temperature of the laser 10 can be assumed to not to caused by a change in ambient temperature since the actual operating time of the optical data transmission element such as the laser 10 in the burst optical communication system is much shorter than an external thermal time constant, and that changes in output from the laser 10 during a very short period of laser emission are clearly caused only by heat radiation from the laser 10. According to this principle, during the short period (burst period or bias light-emitting period) of laser emission, the laser output from the laser 10 must decrease and cannot increase. According to this embodiment, the bias current can be effectively controlled such that the optical output from the laser 10 stably matches the desired varying level without the generation of an oscillation phenomenon in the APC loop, as compared with the thermal compensation control loop based on the conventional bi-directional APC technique. FIG. 3A shows changes in the optical output in accordance with the conventional bi-directional APC technique, and FIG. 3B shows changes in the optical output in accordance with the uni-directional APC technique of the present invention. In the conventional example in FIG. 3A, changes in the optical output are given by a wave-shaped curve wherein the bias current repeatedly increases and decreases until it reaches a stable state. Therefore, the laser is not stably driven. However, according to the present invention shown in FIG. 3B, it is apparent that the bias current is stably controlled with only a minimal change in the optical output.

In addition, according to this embodiment, a mechanism for forcibly decreasing the bias current is not used, unlike in the conventional system. Therefore, the bias control loop is stabilized, and the circuit arrangement necessary for bias control can be simplified. In other words, a simple, low-cost, high-performance system configuration can be obtained to drive the laser 10 so as to produce a stable burst optical output.

FIG. 4 illustrates the overall configuration of an optical output stabilizing unit according to a second embodiment of the present invention. The same reference numerals used in FIG. 4 denote the same parts as in FIG. 1, and a detailed decription thereof will be omitted.

The bias control for a laser 10 is applied to another optical communication system different from the burst optical communication system of the first embodiment (FIG. 1) wherein the burst period is as short as several miliseconds. The optical communication system of the second embodiment is used for a burst signal having a duration longer than several miliseconds or a general continuous optical signal. In this case, temperature changes over time in the external atmosphere cannot be neglected since the optical signal transmission period is long.

Referring to FIG. 4, a bias current generator 60 has a resistor 62 which is connected in parallel with a capacitor 42 and a discharging switch 44, and which serves as a discharge-control device. In the generator 60, an npn transistor 64 is provided between the capacitor 42 and a superposing unit 22 connected to a laser 10. The base of the transistor 64 is connected to a common junction 66 among the capacitor 42, the switch 44 and the resistor 62. The transistor 64 has its collector connected to the unit 22 and its emitter connected to a resistor 68.

According to the second embodiment, when an optical output from the laser 10 is decreased due to the thermal sag phenomenon, the bias current is increased in accordance with the uni-directional APC in the same manner as in the first embodiment. In addition, according to the second embodiment, the uni-directional APC for only increasing the bias current can be performed in principle to eliminate the instability of the optical output which is caused by changes in the ambient temperature.

Figure 5A:
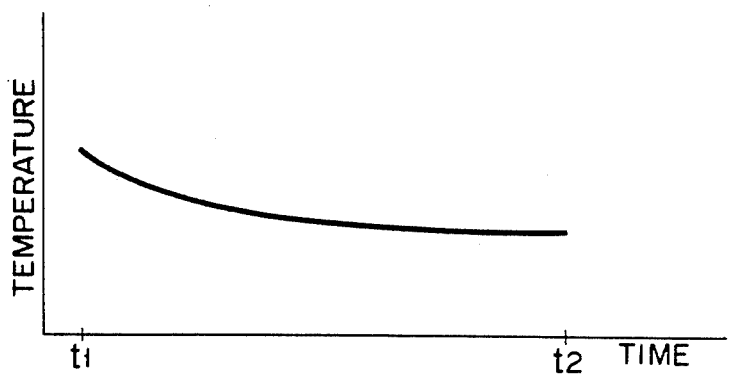
FIGS. 5A to 5D are respectively graphs showing the main characteristics associated with the bias control unit in the second embodiment shown in FIG. 4.
Figure 5B:
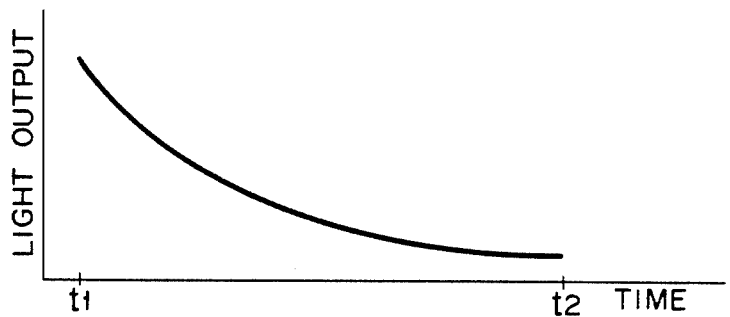
Figure 5C:
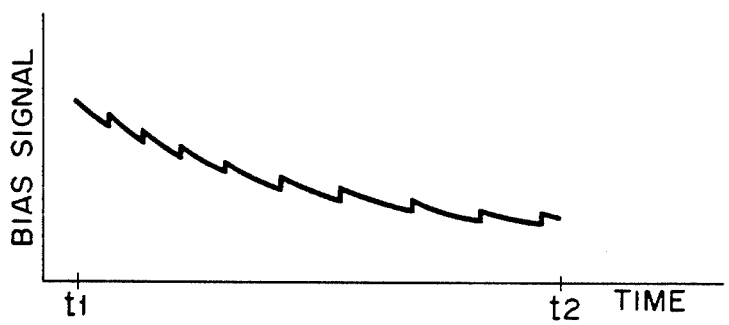

In the optical communication system wherein the signal duration is relatively long and wherein the laser output is sensitive to changes in the ambient temperature even though the data signal comprises a burst signal, when the ambient temperature changes during the burst period (t1 to t2 in each of the graphs shown in FIGS. 5A to 5D) as shown in FIG. 5A or the bias light-emitting period, the laser output from the laser 10 operated at the predetermined bias is decreased, as shown in FIG. 5B. Now assume that a first time constant for the ambient temperature is given as T1, and a second time constant for the decrease in light output is given as T2 (where T1>T2). The second time constant T2 represents a time constant for the decrease in the laser output when the light output stabilizing control (i.e., bias increase) is not performed after an increase in bias current supplied to the laser 10 has stopped.

Figure 5D:
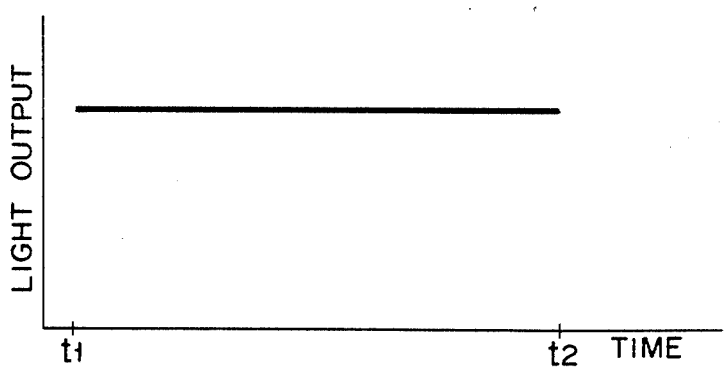

According to the second embodiment shown in FIG. 4, in order to increase the bias current at a third time constant T3 (where T2<T3<T1) greater than the second time constant T2 and smaller than the first time constant T1 after the charging of the capacitor 42 is stopped and after the increase in the bias current supplied to the laser 10 is stopped, the resistance of the resistor 62 for discharging the capacitor 42 must be properly selected. When the bias current is decreased at the third time constant T3 which is larger than the second time constant T2, the burst signal is abruptly lowered, thereby preventing an unstable optical output from the laser 10. In addition, since the third time constant T3 is smaller than the first time constant T1, the control loop for stabilizing the optical output from the laser 10 can be performed in accordance with only the uni-directional APC for bias increase. Even if the sending signal which comprises the burst signal and which is emitted from the laser 10 is influenced by a change in ambient temperature in addition to the heat radiation therefrom, the light output from the laser 10 can be stabilized at a predetermined level, as shown in FIG. 5D.

Attention should be directed to the fact that the resistor 62 as the discharge control device serves to stabilize the APC system so as to match the optical output with a change in ambient temperature. The discharging time constant of the resistor 62 is set to be larger than the time constant at the time of generation of the decreased light output from the laser 10 and to be smaller than the time constant at the time of change in threshold current due to a change in ambient temperature. In this embodiment, the discharging function and the bias increase control function allow a decrease in the bias level prior to a decrease in ambient temperature. Subsequently, the bias current is repeatedly increased and decreased so as to coincide with the optimal level.

The discharge control device comprises a resistor 62 in this embodiment, and the discharging time constant is given by a product of the resistance R thereof and the capacitance C of the charging capacitor 42. However, as described above, the time constant is preset to follow the change in ambient temperature. Therefore, this time constant becomes generally several seconds, and does not interfere with an increase in the bias current.

Although the present invention has been shown and described with respect to particular embodiments, various changes and modifications which are obvious to a person skilled in the art to which the invention pertains are deemed to lie within the spirit and scope of the invention.

In the second embodiment, the discharge control device for discharging the capacitor 42 at the third time constant T3 comprises a resistor. However, this device is not limited to a resistor. Instead, a base current may be injected into a transistor 64 for driving the laser 10.

Furthermore, the discharging time constant is not limited to being set only for a change in ambient temperature. It is essential only that the discharging time constant has a presettable discharge control function which matches a change in output with a change in some external factor. Furthermore, in the first and second embodiments, the semiconductor laser 10 is used as the light-emitting element. However, the bias stabilizing technique of the present invention can be applied to an optical communication system having any other light-emitting element such as a light-emitting diode (LED).

What is claimed is:

1. An apparatus for controlling a bias current supplied to a semiconductor light-emitting element used in an optical communication system to stabilize a light output from said light-emitting element, thereby temperature-compensating changes in the optical output, said apparatus comprising:

(a) photodetector means for detecting light which is emitted from said semiconductor light-emitting element to optically represent a data burst signal for data communication said photodetector means generating a corresponding electrical detection signal while the data burst signal is being transmitted from said light-emitting element; and (b) bias controller means, connected to said semiconductor light-emitting element and said photodetector means, for compensating said light-emitting element by means of a uni-directional automatic power control in such a manner as to only increase a bias current to be supplied to said light-emitting element in response to the detection signal when an optical output from said light-emitting element is adversely decreased below a required level due to heat radiation from said light-emitting element, said bias controller means comprising, comparator means connected to said photodetector means, for receiving a reference signal and the detection signal and for comparing the detection signal with the reference signal to generate a comparison signal, power source means for receiving a constant current, are being charged by the constant current to generate an increasing output current as the bias current, and logic circuit means connected to said comparator means and said power source means, for controlling the supply of the constant current to said power source means in response to the comparison signal in such a manner that said power source means generates the increasing bias current and, after the optical output temporarily reaches the required level, causes the bias current to hold the last increased current level, which bias current is supplied continuously to said light-emitting element while the data burst signal is being transmitted, said logic circuit means causing said power source means supplying again an increasing bias current to said light-emitting element, when the optical output from said light-emitting element is again adversely decreased below the required level even though said bias current of said last increased current level is being continuously supplied to said light-emitting element.

2. The apparatus according to claim 1, wherein said comparator means generates a first comparison signal when the detection signal has a lower level than that of the reference signal and a second comparison signal when the detection signal has a level higher than and equal to that of the reference signal, and wherein said logic circuit means receives the first comparison signal or the second comparison signal, so as to cause said power source means to increase its output bias current in response to the first comparison signal and to inhibit an increase in the output bias current and hold the last bias current level in response to the second comparison signal.

3. The apparatus according to claim 2 wherein said power source means includes capacitor means for storing the constant current to increase the bias current to be supplied to said light emitting element.

4. The apparatus according to claim 3, wherein said bias controller means further comprises discharge-control device means, connected in parallel with said capacitor means, for forcibly discharging said capacitor means at a first time constant which is larger than a second time constant for a natural decrease in optical output of said light-emitting element and which is smaller than a third time constant for an ambient temperature decrease, so as to inhibit a natural increase in the optical output emitted from said light-emitting element when a charging operation of said capacitor means is stopped.

5. An optical signal transmitting apparatus comprising:
 (a) pulse generator means for receiving a data signal for transmission, and for generating a corresponding pulse signal;
 (b) semiconductor light radiator means, connected to said pulse generator means, for radiating, in response to the pulse signal, light which optically represents the data signal;
 (c) photodetector means for partially detecting the actual light radiated from said light radiator means and for generating a corresponding electrical detection signal; and
 (d) bias generator means, electrically connected to said photodetector means and said light radiator means, for receiving a sending request signal which defines a data transmission time of the data signal, and for controlling a radiation time of said light radiator means and being responsive to the detection signal, for regulating a bias current supplied to said light radiator means within the data transmission time so as to compensate light radiation instability caused by thermal influence, said bias generator means performing a unidirectional automatic power control operation such that the bias current is only increased and supplied to said light radiator means to generate light during temperature-compensation of a decrease in said light radiator means due to thermal influence within a data transmission time, and said bias generator means comprising,
 output light stabilizing control circuit means for increasing the bias current which is lowered below a predetermined reference level when the output light from said light-radiator means is of a lower intensity within the data transmission time and, when the detection signal is of a higher level than the predetermined reference level, for holding the bias current at a last current level, which current is supplied to said light-radiator means to continuously energize said light-radiator means, said output light stabilizing control circuit means including current source means for producing a constant current, capacitor means for receiving the constant current to be charged thereby, and current control circuit means for receiving the sending request signal and the detection signal, and for controlling supply of the constant current to said capacitor means.

6. The apparatus according to claim 5, wherein said bias generator means receives the sending request signal for specifying a data transmission time which is short enough to permit the influence of an ambient temperature change on said light radiator means to be substantially neglected and to regard the light radiated from said light radiator means to be decreased only by heat radiation from itself.

7. The apparatus according to claim 6, further comprising:
 (e) superposing means, electrically connected to said light radiator means, said pulse generator means and said bias generator means, for superposing the pulse signal from said pulse generator means on the bias current from said bias generator means, thereby supplying a superposed signal to said light radiator means.

8. The apparatus according to claim 7, wherein said bias generator means receives the sending request signal for specifying a data transmission time which is long enough to regard the output light from said light radiator means to be influenced by an ambient temperature change and heat radiation thereof; and wherein said bias generator means comprises: first control circuit means for increasing a bias current supplied to said light radiator means in response to the detection signal which is lowered below a predetermined reference level when the output light from said light radiator means has a lower intensity within the data transmission time, and for holding the bias current at a last current level when the detection signal has a higher level than the predetermined reference level; and second control circuit means, electrically connected to said first control circuit means, for forcibly decreasing the bias current at a first time constant which is larger than a second time constant for a natural decrease in optical output of said light-emitting element and which is smaller than a third time constant for an ambient temperature change when said first control circuit means holds the bias current at the predetermined reference level, thereby preventing the light output of said light radiator means from being naturally increased due to an ambient temperature decrease.

9. The apparatus according to claim 8, wherein said output light stabilizing control circuit means comprises:
 current source means for producing a constant current;
 capacitor means for receiving the constant current to be charged thereby; and
 current control circuit means for receiving the sending request signal and the detection signal, and for controlling supply of the constant current to said capacitor means.

10. The apparatus according to claim 9, wherein said current control circuit means includes:
 a comparator, connected to said photodetector means, for comparing a level of the detection signal with the reference level and generating a comparison signal;

a transistor circuit, connected between said capacitor means and said current source means, for performing switching operation; and logic circuit means, connected to said comparator and said transistor circuit, for controlling the switching operation of said transistor circuit in response to the sending request signal and the comparison signal, whereby supply and cutoff operations of the constant current with respect to said capacitor means are performed.

11. The apparatus according to claim 10, wherein said second control circuit means includes discharge-control device means, connected in parallel with said capacitor means, for partially discharging said capacitor means.

12. The apparatus according to claim 5, wherein said current control circuit means includes:

a comparator, connected to said photodetector means, for comparing a level of the detection signal with the reference level and generating a comparison signal;

a transistor circuit, connected between said capacitor means and said current source means, for performing switching operation; and logic circuit means, connected to said comparator and said transistor circuit, for controlling the switching operation of said transistor circuit in response to the sending request signal and the comparison signal, whereby supply and cutoff operations of the constant current with respect to said capacitor means are performed.

13. The apparatus according to claim 12, wherein the data transmission time is set to be a maximum of several miliseconds, thereby achieving burst optical data transmission.

14. An apparatus for controlling a bias current supplied to a semiconductor light-emitting element used in an optical communication system to stabilize a light output from said light-emitting element, comprising:

(a) photodetector means for detecting light emitted from said semiconductor light-emitting element and for generating a corresponding electrical detection signal; and (b) bias controller means, connected to said semiconductor light-emitting element and said photodetector means, for compensating said light-emitting element by means of uni-directional automatic power control such that a bias current to be supplied to said light-emitting element is increased in response to the detection signal when an optical output is adversely affected by heat radiation from said semiconductor light-emitting element and is thereby lowered said bias controller means including:

comparator means, connected to said photodetector means, for receiving a reference signal and the detection signal and for generating a first comparison signal when the detection signal has a lower level than that of the reference signal and a second comparison signal when the detection signal has a higher level than and an equal level to that of the reference signal;

power source means, connected to said light-emitting element for generating a variable bias current, including capacitor means for receiving a constant current, storing the constant current, and increasing the bias current to be supplied to said light-emitting element; and logic circuit means, connected to said comparator means and said power source means, for receiving a light emission instruction signal for specifying a light emission timing of said light-emitting element and selectively receiving the first and second comparison signals, so as to cause said power source means to increase an output bias current in response to the first comparison signal and to inhibit an increase in the output bias current and hold a last bias current level in response to the second comparison signal.

* * * * *